(12) United States Patent
Park et al.

(10) Patent No.: US 7,820,308 B2
(45) Date of Patent: Oct. 26, 2010

(54) SURFACE-COATED HARD MATERIAL FOR CUTTING TOOLS OR WEAR-RESISTANT TOOLS

(75) Inventors: Geun Woo Park, Cheongju (KR);
Chang Kyu Hwang, Jecheon (KR);
Yong Hee Choi, Cheongju (KR); Yeo Kyun Yoon, Daejeon (KR)

(73) Assignee: Korloy Inc., Cheongju (KR)

( * ) Notice: Subject to any disclaimer, the term of this patent is extended or adjusted under 35 U.S.C. 154(b) by 0 days.

(21) Appl. No.: 10/989,497

(22) Filed: Nov. 17, 2004

(65) Prior Publication Data
US 2006/0003186 A1  Jan. 5, 2006

(30) Foreign Application Priority Data
Jun. 30, 2004 (KR) .................... 10-2004-0050452

(51) Int. Cl.
 *B32B 9/00* (2006.01)
(52) U.S. Cl. .................... 428/697; 51/307; 51/309; 428/216; 428/336; 428/698; 428/699; 428/701; 428/702; 428/704
(58) Field of Classification Search ............. 428/697, 428/698, 699, 701, 702, 216, 704, 336; 51/307, 51/309
See application file for complete search history.

(56) References Cited

U.S. PATENT DOCUMENTS

| | | | |
|---|---|---|---|
| 4,239,536 A * | 12/1980 | Yamamoto et al. ............ 75/238 |
| 4,594,294 A * | 6/1986 | Eichen et al. ................ 428/698 |
| 4,895,770 A * | 1/1990 | Schintlmeister et al. ...... 428/698 |
| 5,318,840 A * | 6/1994 | Ikeda et al. .................. 428/697 |
| 5,766,782 A * | 6/1998 | Ljungberg ................... 428/698 |
| 5,861,210 A * | 1/1999 | Lenander et al. ............ 428/702 |
| 5,882,778 A * | 3/1999 | Sugizaki et al. ............. 428/704 |
| 6,090,476 A * | 7/2000 | Thysell et al. .............. 428/698 |
| 6,293,739 B1 * | 9/2001 | Uchino et al. ............... 428/216 |
| 6,333,103 B1 * | 12/2001 | Ishii et al. ................... 428/701 |
| 6,337,152 B1 * | 1/2002 | Kukino et al. ............... 428/698 |
| 6,713,172 B2 * | 3/2004 | Ljungberg et al. ........... 428/699 |
| 6,756,111 B1 * | 6/2004 | Okada et al. ................ 428/698 |
| 6,811,580 B1 * | 11/2004 | Littecke ...................... 428/216 |
| 7,087,295 B2 * | 8/2006 | Okada et al. ................ 428/699 |

FOREIGN PATENT DOCUMENTS

DE  29818029  * 3/1999
JP  10-140330  * 5/1998

* cited by examiner

*Primary Examiner*—Archene Turner
(74) *Attorney, Agent, or Firm*—Birch, Stewart, Kolasch & Birch, LLP

(57) ABSTRACT

The present invention provides a thin film coated on a cutting tool surface made of cemented carbides, cermets or ceramics. According to the present invention, an $\alpha$-$Al_2O_3$ thin film is deposited on a TiAlvBwCxNyOz (v+w+x+y+z=1, v, w, x, y, z$\geq$0) thin film in a thickness of 2-15 µm, so that the ratio of TC (104) (denoting the texture coefficient of the (104) crystal plane of the polycrystalline $\alpha$-$Al_2O_3$ thin film) to TC (012) (denoting the texture coefficient of the (012) crystal) is more than 1.3. Cutting tools coated with such a thin film have improved wear resistance and adhesion.

18 Claims, 1 Drawing Sheet

SURFACE-COATED HARD MATERIAL FOR CUTTING TOOLS OR WEAR-RESISTANT TOOLS

TECHNICAL FIELD

The present invention relates to a thin film coated on cemented carbide which is used as an indexable insert, and more particularly, to a hard ceramic thin film with excellent wear resistance, which is used to improve the wear resistance of cutting tools, as well as cutting tools coated with such a thin film.

BACKGROUND ART

Generally, in order to improve the service life of cutting tools, a hard ceramic thin film made of titanium carbide (TiC), titanium nitride (TiN), titanium carbon nitride (TICN) or alumina ($Al_2O_3$) is coated on the surface of a base metal for cemented carbide by chemical vapor deposition (CVD). Regarding cutting tools coated with $Al_2O_3$, a cutting tool comprising an $Al_2O_3$ thin film of 0.5-1 μm coated on a TiC thin film was introduced to the world for the first time in the world in 1973. The cutting tool comprising $Al_2O_3$ coated on TiC was slightly lower in toughness but significantly higher in wear resistance than a monolayer TiC thin film.

Also, in order to improve the toughness of cutting tools, a TiCN thin film is used which is coated using organic CN compound precursors (acetonitrile, $CH_3CN$) at a temperature of 800-900° C. by middle temperature-chemical vapor deposition (MT-CVD). The deposition of the conventional TiCN thin film by high temperature-chemical vapor deposition (HT-CVD) was performed using gas materials including $TiCl_4$, $CH_4$, $N_2$ and $H_2$, at a temperature of about 1,000-1,200° C., whereas the coating by MT-CVD was performed using $TiCl_4$, $CH_3CN$, $N_2$ and $H_2$, at a temperature of 800-900° C. The TiCN thin film coated by MT-CVD is slightly lower in hardness than the TiC thin film, but it has hardness sufficient to provide an improvement in wear resistance and is excellent in toughness since it has a columnar structure.

In the case of $Al_2O_3$ thin films with excellent oxidation resistance, since it was reported in studies on phase control technology for $Al_2O_3$ thin films in the 1980s that alpha-alumina ($\alpha$-$Al_2O_3$) and kappa-alumina ($\kappa$-$Al_2O_3$) thin films are suitable for cast iron and steel, respectively, control technology for the $Al_2O_3$ thin films has been rapidly developed and commercially used. The $\alpha$-$Al_2O_3$ thin film among the $Al_2O_3$ thin films is a unique stable phase which does not undergo a phase change during processing, and it has the best hardness. Thus, it shows excellent cutting performance in cast iron processing which is performed under high-speed cutting conditions. It was analyzed that the $\kappa$-$Al_2O_3$ thin film is lower in thermal conductivity than the $\alpha$-$Al_2O_3$ thin film and thus shows excellent wear resistance in steel cutting, which generates much heat.

In currently commercially available cutting tools, since the $Al_2O_3$ thin film is always applied to ceramic substrates, TiC or TiCN-coated carbides, the interfacial adhesion between the TiC or TiCN thin film surface and the $Al_2O_3$ coating layer is very important. In this regard, the TiC or TiCN thin film may be represented by the formula $TiAl_vB_wC_xN_yO_z$ (v+w+x+y+z=1, v, w, x, y, z$\geq$0) wherein Ti in the TiC or TiN thin film is completely or partially substituted with Al, and carbon (C) or carbon nitride (CN) is completely or partially substituted with boron, oxygen or nitrogen.

EP Nos. 408535 and 603144 disclose coating the $\alpha$-$Al_2O_3$ thin film on cutting tools in order to increase the wear resistance of the cutting tools in cast iron turning. However, such patents do not disclose the crystallographic structure of the $\alpha$-$Al_2O_3$ thin film which shows excellent cutting performance.

DISCLOSURE OF THE INVENTION

Accordingly, an object of the present invention is to provide an $\alpha$-$Al_2O_3$ thin film with excellent cutting performance, and to provide an $\alpha$-$Al_2O_3$ phase having the desired crystallographic structure on a hard material or a thin film of $TiAl_vB_wC_xN_yO_z$ (v+w+x+y+z=1, v, w, x, y, z$\geq$0) by controlling the nucleation and growth conditions of an $Al_2O_3$ phase.

Another object of the present invention is to provide cutting tools deposited with an $\alpha$-$Al_2O_3$ thin film which has improved cutting performance for steel, stainless steel, and cast iron, particularly general cast iron and spherical graphite cast iron.

In order to achieve the above objects, in one aspect, the present invention provides a polycrystalline $\alpha$-$Al_2O_3$ thin film deposited on a base metal for cutting tools or wear-resistant tools, in which the ratio of TC (104) (denoting the texture coefficient of the (104) crystal plane) to TC (012) (denoting the texture coefficient of the (012) crystal plane) in the $\alpha$-$Al_2O_3$ thin film is more than 1.3. The inventive $\alpha$-$Al_2O_3$ thin film has a characteristic in that it is first grown in the (104) direction when measured by X-ray diffraction (XRD) analysis, and a texture coefficient (TC) for the $\alpha$-$Al_2O_3$ thin film is defined by the following equation:

$$TC(hkl) = \frac{I(hkl)}{I_0(hkl)} \left\{ \frac{1}{n} \sum \frac{I(hkl)}{I_0(hkl)} \right\}^{-1}$$

wherein I(hkl) denotes the diffraction intensity of crystal planes, $I_0$(hkl) denotes the standard diffraction intensity of ASTM standard powder diffraction data, n denotes the number of crystal planes used for calculation, and crystal planes (hkl) used are (012), (104), (110), (113), (024), (116), (124) and (030).

The inventive $\alpha$-$Al_2O_3$ thin film is preferably deposited on a thin film of $TiAl_vB_wC_xN_yO_z$ (v+w+x+y+z=1, v, w, x, y, z$\geq$0). In depositing the $TiAl_vB_wC_xN_yO_z$ (v+w+x+y+z=1, v, w, x, y, z$\geq$0) thin film on a surface for cutting tools or wear-resistant tools, $BCl_3$ is preferably used in the amount of 0.1-0.4 vol %.

In another aspect, the present invention provides a surface-coated material comprising: at least one material deposited on a base metal for cutting tools or wear-resistant tools, the deposited material being selected from the group consisting of IV-A group metal nitride, carbide, carbon nitride, oxynitride, carbon oxide and carbon oxynitride, and IV-A group metal carbon nitride and carbon oxynitride with a columnar structure; a thin film of $TiAl_vB_wC_xN_yO_z$ (v+w+x+y+z=1, v, w, x, y, z$\geq$0) deposited on the deposited material; and at least one material deposited on the $TiAl_vB_wC_xN_yO_z$ thin film by CVD, the deposited material being selected from the group consisting of $Al_2O_3$, $ZrO_2$, $HfO_2$, $Y_2O_3$, AlN, CBN, and $TiB_2$.

In the surface-coated material, the phase of $Al_2O_3$ is preferably alpha ($\alpha$), and the $Al_2O_3$ thin film is preferably a polycrystalline $\alpha$-$Al_2O_3$ thin film. The $Al_2O_3$ thin film is a polycrystalline $\alpha$-$Al_2O_3$ thin film in which the ratio of TC (104) (denoting the texture coefficient of the (104) crystal plane) to TC (012) (denoting the texture coefficient of the (012) crystal plane) is more than 1.3, particularly more than 1.5.

The uppermost thin film coated on the base metal surface for tools preferably contains at least one material selected from the group consisting of IV-A group metal nitride, carbide, carbon nitride, oxynitride, carbon oxide and carbon oxynitride, which are deposited by high temperature-chemical vapor deposition, and IV-A group metal carbon nitride and carbon oxynitride with a columnar structure, which are deposited by middle temperature-chemical vapor deposition.

The uppermost thin film is preferably subjected to dry or wet blasting with $Al_2O_3$ powder so as to improve its surface roughness.

Accordingly, the present invention provides the $\alpha$-$Al_2O_3$ thin film which is coated on a cutting tool surface made of materials, such as cemented carbides, cermets or ceramics. In the thin film, the ratio of TC (104) (denoting the texture coefficient of the (104) crystal plane) to TC (012) (denoting the texture coefficient of the (012) crystal plane) is preferably more than 1.3, particularly more than 1.5. In addition, the present invention provides cutting tools coated with such a thin film, in which the thin film is preferably coated in a thickness of 2-15 μm, particularly 3-10 μm, by HT-CVD.

In the present invention, a thin film of $TiAl_vB_wC_xN_yO_z$ (v+w+x+y+z=1, v, w, x, y, z≧0) was formed by the additional use of a given amount of $AlCl_3$ and $BCl_3$ as raw materials for adding Al and B to a thin film composition, in addition to the prior HT-CVD coating method of forming a thin film of $TiC_xN_yO_z$ (x+y+z=1, x, y, z≧0) using raw material gas including $TiCl_4$, $CH_4$, $H_2$, $N_2$, $CO_2$ and CO, at a temperature of 1,000-1,100° C. At this time, the thickness of the formed thin film is preferably 0.1-5 μm, particularly 0.5-3 μm.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
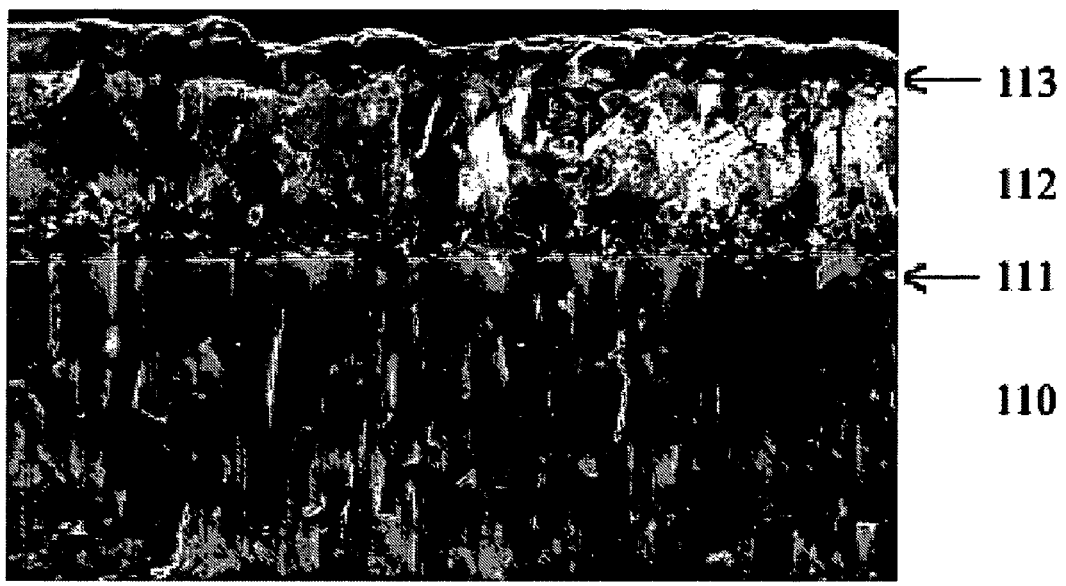
FIG. 1 is a SEM photograph at 5,000×magnification, which shows the shape of an $\alpha$-$Al_2O_3$ thin film deposited on a $TiAl_vB_wC_xN_yO_z$ (v+w+x+y+z=1, v, w, x, y, z≧0) thin film formed according to the present invention.

Hereinafter, the present invention will be described in further detail by way of examples. It is to be understood, however, that these examples are given for illustrative purposes only and are not intended to limit the scope of the present invention.

Example 1

(A) On ISO 15K-cemented carbide for coated cutting tools, a TiCN thin film was deposited in a thickness of 10 μm by MT-CVD. On the deposited TiCN film, a thin film of $TiAl_vB_wC_xN_yO_z$ (v+w+x+y+z=1, v, w, x, y, z≧0) according to the present invention was deposited in a thickness of 0.5 μm, on which an $\alpha$-Al2O3 thin film was then deposited in a thickness of 5 μm.

The results of X-ray diffraction analysis showed that the ratio of TC (104) (denoting the texture coefficient of the (104) crystal plane of the polycrystalline $\alpha$-$Al_2O_3$ film) to TC (012) (denoting the texture coefficient of the (012) crystal plane) was 1.55.

(B) On ISO 15K-cemented carbide for coated cutting tools, a TiCN thin film was deposited in a thickness of 10 μm by MT-CVD. On the deposited TiCN film, a thin film of $TiC_xN_yO_z$ (x+y+z=1, x, y, z≧0) according to the prior art was deposited in a thickness of 0.5 μm, on which an $\alpha$-$Al_2O_3$ thin film was then deposited in a thickness of 5 μm.

(C) On ISO 15K-cemented carbide for coated cutting tools, a TiCN thin film was deposited in a thickness of 8 μm by MT-CVD. On the deposited TiCN thin film, a $\kappa$-$\alpha$-$Al_2O_3$ thin film was deposited in a thickness of 4 μm.

The coated cutting tools of (A), (B) and (C) were subjected to dry or wet blasting with 200-mesh $\alpha$-$Al_2O_3$ powder so as to improve their surface roughness.

The cutting performance of the coated cutting tools according to the prior art (B and C) and the coated cutting tool according to the present invention (A) were evaluated by processing work pieces with the tools for the same time period of 10 minutes, measuring wear occurring at the tool flank and analyzing tool edge chipping. The evaluation results are given in Table 1. As can be seen in Table 1, the inventive tool (A) had improved chipping resistance and wear resistance as compared to the prior tools (B and C).

<Cutting Test Conditions>

Cutting conditions: V=300 m/min, f=0.3 mm/rev., d=2.0 mm, wet processing;

Work pieces: GC 25 (300-mm diameter and 600-mm length), outer diameter processing; and Tool Type No.: CNMG120408-GR.

TABLE 1

|  | Sample | Edge chipping (%) | Tool flank wear (mm) |
|---|---|---|---|
| Invention | A | 0 | 0.137 |
| Prior art | B | 50 | 0.145 |
| Prior art | C | 30 | 0.167 |

Example 2

(E) On ISO 15K-cemented carbide for coated cutting tools, a TiCN thin film was deposited in a thickness of 10 μm by MT-CVD. On the deposited TiCN film, a thin film of $TiAl_vB_wC_xN_yO_z$ (v+w+x+y+z=1, v, w, x, y, z≧0), according to the present invention, was deposited in a thickness of 0.5 μm, on which an $\alpha$-$Al_2O_3$ thin film was then deposited in a thickness of 7 μm.

The results of X-ray diffraction analysis showed that the ratio of TC (104) (denoting the texture coefficient of the polycrystalline $\alpha$-$Al_2O_3$ (104) crystal plane) to TC (012) (denoting the texture coefficient of the (012) crystal plane) was 1.59.

(F) On ISO 15K-cemented carbide for coated cutting tools, a TiCN thin film was deposited in a thickness of 10 μm by MT-CVD. On the deposited TiCN film, a thin film of $TiC_xN_yO_z$ (x+y+z=1, x, y, z≧0) according to the prior art was deposited in a thickness of 0.5 μm, on which an $\alpha$-$Al_2O_3$ thin film was then deposited in a thickness of 7 μm.

(G) On ISO 15K-cemented carbide for coated cutting tools, a TiCN thin film was deposited in a thickness of 8 μm by MT-CVD. On the deposited TiCN thin film, a $\kappa$-$Al_2O_3$ thin film was deposited in a thickness of 5 μm.

The coated cutting tools of (E), (F) and (G) were subjected to dry or wet blasting with 200-mesh $\alpha$-$Al_2O_3$ powder so as to improve their surface roughness.

The cutting performance of the coated cutting tools according to the prior art (F and G) and the coated cutting tool according to the present invention (E) were evaluated by processing work pieces with the tools for the same time period of 10 minutes, measuring wear occurring at the tool flank and analyzing tool edge chipping. The evaluation results are given in Table 2. As can be seen in Table 2, the inventive tool (E) had improved chipping resistance and wear resistance compared to the prior tools (F and G).

<Cutting Test Conditions>

Cutting conditions: V=400 m/min, f=0.3 mm/rev., d=2.0 mm, wet processing;

Work pieces: GC 25 (300-mm diameter and 600-mm length), outer diameter processing; and Tool Type No.: CNMG120408-GR.

TABLE 2

| | Sample | Edge chipping (%) | Tool flank wear (mm) |
|---|---|---|---|
| Invention | E | 0 | 0.110 |
| Prior art | F | 70 | 0.154 |
| Prior art | G | 50 | 0.177 |

INDUSTRIAL APPLICABILITY

As described above, according to the present invention, the TiAlvBwCxNyOz (v+w+x+y+z=1, v, w, x, y, z≧0) thin film is deposited on cutting tools in a thickness of 0.1-5 μm by HT-CVD, on which the α-Al$_2$O$_3$ thin film is then deposited in a thickness of 2-15 μm, so that the ratio of TC (104) (denoting the texture coefficient of the (104) crystal plane of the polycrystalline α-Al$_2$O$_3$ thin film) to TC (012) (denoting the texture coefficient of the (012) crystal) is more than 1.3. In this case, the wear resistance, chipping resistance and toughness of the cutting tools can be greatly improved.

Although the preferred embodiment of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A polycrystalline α-Al$_2$O$_3$ thin film deposited on a base metal for cutting tools or wear-resistant tools by high temperature-chemical vapor deposition, in which the ratio of TC (104) (denoting the texture coefficient of the (104) crystal plane) to TC (012) (denoting the texture coefficient of the (012) crystal plane) in the α-Al$_2$O$_3$ thin film is more than 1.3, the texture coefficient being defined by the following equation:

$$TC(hkl) = \frac{I(hkl)}{I_0(hkl)} \left\{ \frac{1}{n} \sum \frac{I(hkl)}{I_0(hkl)} \right\}^{-1}$$

wherein I(hkl) denotes the diffraction intensity of crystal planes, I$_0$(hkl) denotes the standard diffraction intensity of ASTM standard powder diffraction data, n denotes the number of crystal planes used for calculation, and crystal planes (hkl) used are (012), (104), (110), (113), (024), (116), (124) and (030), and wherein the α-Al$_2$O$_3$ thin film is deposited on a thin film of TiAlvBwCxNyOz (v+w+x+y+z=1, x, y≧0; v>0; w>0; z>0), and wherein BCl$_3$ is used in an amount of 0.1-0.4 vol% in the deposition of the TiAlvBwCxNyOz (v+w+x+y+z=1, x, y≧0; v>0; w>0; z>0) thin film.

2. The thin film of claim 1, wherein said TiAlvBwCxNyOz (v+w+x+y+z=1, x, y≧0; v>0; w>0; z>0) thin film is 0.1-5μm in thickness and said α-Al$_2$O$_3$ thin film is 2-15μm in thickness.

3. The thin film of claim 1, wherein a phase of said polycrystalline α-Al$_2$O$_3$ thin film consists essentially of α phase.

4. The thin film of claim 1, wherein a phase of said polycrystalline α-Al$_2$O$_3$ thin film consists of α phase.

5. The thin film of claim 1, wherein the ratio of TC (104) to TC (012) in the α-Al$_2$O$_3$ thin film is more than 1.5.

6. The thin film of claim 1, wherein the ratio of TC (104) to TC (012) in the α-Al$_2$O$_3$ thin film is more than 1.55.

7. The thin film of claim 1, wherein the ratio of TC (104) to TC (012) in the α-Al$_2$O$_3$ thin film is more than 1.59.

8. The polycrystalline α-Al$_2$O$_3$ thin film deposited on a base material according to claim 1, wherein v+w+x+y+z=1, and v, w, x, y, z>0.

9. A surface-coated material for cutting tools or wear resistant tools, which comprises:

at least one material deposited on a base material for cutting tools or wear-resistant tools, the deposited material being selected from the group consisting of IV-A group metal nitride, carbide, carbon nitride, oxynitride, carbon oxide and carbon oxynitride, and IV-A group metal carbon nitride and carbon oxynitride with a columnar structure;

a thin film TiAlvBwCxNyOz (v+w+x+y+z=1, x, y≧0; v>0; w>0; z>0) deposited on the deposited material; and at least one material deposited on the TiAlvBwCxNyOz thin film by chemical vapor deposition, the deposited material being selected from the group consisting of Al$_2$O$_3$, ZrO$_2$, HfO$_2$, Y$_2$O$_3$, AlN, CBN, and TiB$_2$, wherein BCl$_3$ is used in an amount of 0.1-0.4vol% in the deposition of the TiAlvBwCxNyOz (v+w+x+y+z=1, x, y≧0; v>0; w>0; z>0) thin film.

10. The surface-coated material of claim 9, wherein the material deposited on the TiAlvBwCxNyOz thin film is at least Al$_2$O$_3$ and the phase of the Al$_2$O$_3$ film is alpha (α).

11. The surface-coated material of claim 10, wherein said TiAlvBwCxNyOz (v+w+x+y+z=1, x, y≧0; v>0; w>0; z>0) thin film is 0.1-5μm in thickness and said α-Al$_2$O$_3$ thin film is 2-15μm in thickness.

12. The surface-coated material of claim 9, wherein the material deposited on the TiAlvBwCxNyOz thin film is at least Al$_2$O$_3$ and the Al$_2$O$_3$ thin film is a polycrystalline α-Al$_2$O$_3$ thin film in which the ratio of TC (104) (denoting the texture coefficient of the (104) crystal plane) to TC (012) (denoting the texture coefficient of the (012) crystal plane) in the α-Al$_2$O$_3$ thin film is more than 1.3, the texture coefficient being defined by the following equation:

$$TC(hkl) = \frac{I(hkl)}{I_0(hkl)} \left\{ \frac{1}{n} \sum \frac{I(hkl)}{I_0(hkl)} \right\}^{-1}$$

wherein I(hkl) denotes the diffraction intensity of crystal planes, I$_0$(hkl) denotes the standard diffraction intensity of ASTM standard powder diffraction data, n denotes the number of crystal planes used for calculation, and crystal planes (hkl) used are (012), (104), (110), (113), (024), (116), (124) and (030).

13. The surface-coated material of claim 12, wherein the ratio of TC (104) to TC (012) in the α-Al$_2$O$_3$ thin film is more than 1.5.

14. The surface-coated material of claim 12, wherein the ratio of TC (104) to TC (012) in the α-Al$_2$O$_3$ thin film is more than 1.55.

15. The surface-coated material of claim 12, wherein the ratio of TC (104) to TC (012) in the α-Al$_2$O$_3$ thin film is more than 1.59.

16. The surface-coated material of claim 9, wherein said material deposited on the TiAl$_v$B$_w$C$_x$N$_y$O$_z$ thin film consists essentially of an α-Al$_2$O$_3$ thin film.

17. The surface-coated material of claim 9, wherein said material deposited on the TiAl$_v$B$_w$C$_x$N$_y$O$_z$ thin film consists of an α-Al$_2$O$_3$ thin film.

18. The surface-coated material of claim 9, wherein v+w+x+y+z=1, and v, w, x, y, z>0.

* * * * *